(12) United States Patent
Nakagawa

(10) Patent No.: US 10,581,425 B2
(45) Date of Patent: Mar. 3, 2020

(54) SEMICONDUCTOR DEVICE

(71) Applicant: FUJI ELECTRIC CO., LTD., Kanagawa (JP)

(72) Inventor: Sho Nakagawa, Nagano (JP)

(73) Assignee: FUJI ELECTRIC CO., LTD., Kanagawa (JP)

(*) Notice: Subject to any disclaimer, the term of this patent is extended or adjusted under 35 U.S.C. 154(b) by 0 days.

(21) Appl. No.: 16/234,860

(22) Filed: Dec. 28, 2018

(65) Prior Publication Data

US 2019/0253046 A1 Aug. 15, 2019

(30) Foreign Application Priority Data

Feb. 14, 2018 (JP) ................................. 2018-024578

(51) Int. Cl.
| H03K 3/00 | (2006.01) |
|---|---|
| H03K 17/06 | (2006.01) |
| H03K 17/687 | (2006.01) |
| H03K 17/0812 | (2006.01) |
| G01R 19/165 | (2006.01) |

(52) U.S. Cl.
CPC . *H03K 17/08122* (2013.01); *G01R 19/16519* (2013.01)

(58) Field of Classification Search
CPC ................... H03K 17/08122; G01R 19/16519
See application file for complete search history.

(56) References Cited

U.S. PATENT DOCUMENTS

| 5,365,118 A * | 11/1994 | Wilcox | H02M 1/38 |
| | | | 327/109 |
| 5,514,995 A * | 5/1996 | Hennig | G05F 1/565 |
| | | | 327/170 |
| 5,559,452 A * | 9/1996 | Saito | H03K 17/063 |
| | | | 326/27 |
| 6,005,761 A * | 12/1999 | Izawa | H03K 17/0822 |
| | | | 361/103 |
| 6,885,225 B2 * | 4/2005 | Ohmichi | H02M 7/538 |
| | | | 327/108 |
| 7,388,422 B2 * | 6/2008 | Khan | H02M 3/07 |
| | | | 327/112 |

(Continued)

FOREIGN PATENT DOCUMENTS

| JP | 2014-138521 A | 7/2014 |
| WO | WO 2016/143382 A1 | 9/2016 |

*Primary Examiner* — Kenneth B Wells
(74) *Attorney, Agent, or Firm* — Paratus Law Group, PLLC

(57) ABSTRACT

A semiconductor device includes a power semiconductor switching element, a comparator circuit, a filter circuit and an erroneous-detection prevention circuit. The comparator circuit compares a value of an output voltage of the switching element with a threshold and outputs a comparison result as a determination signal. The filter circuit outputs the determination signal to the control circuit after a delay time required for the output voltage of the switching element to reach a predetermined voltage value for determining that the switching element is in a normal ON state after the switching element is turned on. The erroneous-detection prevention circuit changes a turn-on time of the switching element, the delay time, or a voltage value of the determination signal when a voltage of the power supply drops in a case where the switching element is normally turned on.

8 Claims, 10 Drawing Sheets

(56) References Cited

U.S. PATENT DOCUMENTS 8,558,586 B1 * 10/2013 Martin ................ G11C 7/1057
327/108
2017/0179820 A1 6/2017 Zhang

* cited by examiner

SEMICONDUCTOR DEVICE

CROSS-REFERENCE TO RELATED APPLICATIONS

The present application claims priority from Japanese Patent Application No. 2018-024578, filed Feb. 14, 2018, the entire content of which is incorporated herein by reference.

TECHNICAL FIELD

The present invention relates to a semiconductor device for driving a load, and more particularly to a semiconductor device which can prevent an error in overcurrent state detection in order to secure operation performance in the case where the voltage of a power supply drops during a normal operation.

BACKGROUND ART

Some semiconductor devices for driving a load with electric power which is supplied from a power supply by switching of a power semiconductor switching element have a protection function in order to prevent overcurrent from flowing through the power semiconductor switching element, resulting in a breakdown of the element (see JP-A-2014-138521 and WO 2016/143382 for instance).

Such a type of semiconductor device determines whether overcurrent is flowing in a power semiconductor switching element based on whether the value of the output voltage of the power semiconductor switching element is higher or lower than a predetermined threshold. However, when the power semiconductor switching element is turned on, at first, the output voltage of the power semiconductor switching element is lower than the predetermined threshold for determining that the power semiconductor switching element is in a normal ON state. Therefore, if determination is performed in that state, it may be erroneously determined that the power semiconductor switching element is not in the normal ON state. In other words, an overcurrent state may be erroneously detected. For this reason, a filter for setting a delay time may be provided such that after the power semiconductor switching element is turned on, when the delay time elapses, in other words, when the output voltage reaches the predetermined threshold for determining that the power semiconductor switching element is in the normal ON state, the filter outputs the result of comparison between the value of the output voltage and the threshold to the control circuit side to perform determination.

In the meantime, during a normal operation, the voltage of the power supply may drop for any reason. In this case, even if the delay time set by the filter elapses, the output voltage of the power semiconductor switching element may not reach the predetermined voltage value for determining that the power semiconductor switching element is in the normal ON state. Therefore, an overcurrent state may be erroneously detected, and the whole of the semiconductor device may not be able to normally operate.

SUMMARY

An aspect of the present invention provides a semiconductor device which can prevent an error in overcurrent state detection in order to secure operation performance in the case where the voltage of a power supply drops during a normal operation.

A semiconductor device which includes a power semiconductor switching element configured to drive a load with electric power from a power supply by switching, and which is configured to output a determination signal for detecting whether the power semiconductor switching element is in a normal ON state to a control circuit configured to perform the corresponding detection. The semiconductor device includes:

a comparator circuit configured to compare a value of an output voltage of the power semiconductor switching element with a threshold representing an overcurrent state of the power semiconductor switching element and output a comparison result as the determination signal;

a filter circuit provided on an output side of the comparator circuit so as to output the determination signal to the control circuit after a delay time required for the output voltage of the power semiconductor switching element to reach a predetermined voltage value for determining that the power semiconductor switching element is in the normal ON state after the power semiconductor switching element is turned on; and an erroneous-detection prevention circuit configured to change a turn-on time of the power semiconductor switching element, the delay time, or a voltage value of the determination signal when a voltage of the power supply drops in a case where the power semiconductor switching element is normally turned on, so as to prevent an error in overcurrent state detection which is performed by the control circuit.

The semiconductor device for driving a load by switching of the power semiconductor switching element compares the value of the output voltage of the power semiconductor switching element with the predetermined threshold, so as to detect whether overcurrent is flowing in the power semiconductor switching element, to prevent an element breakdown of the power semiconductor switching element due to overcurrent. When the power semiconductor switching element is turned on, at first, the value of the output voltage of the power semiconductor switching element is lower than the predetermined voltage value for determining that the power semiconductor switching element is in the normal ON state. If the value of the output voltage of the power semiconductor switching element and the threshold are compared in that state by the comparator circuit, it may be determined that the power semiconductor switching element is not in the normal ON state. For this reason, the filter circuit is provided such that when the delay time set by the filter circuit elapses, in other words, when the value of the output voltage reaches the predetermined voltage value for determining that the power semiconductor switching element is in the normal ON state, the filter circuit outputs the comparison result of the comparator circuit to the control circuit side, to prevent an error in overcurrent state detection.

However, even when the semiconductor device is normally operating, the voltage of the power supply may drop for any reason. In this case, even when the delay time elapses, the output voltage of the power semiconductor switching element does not reach the predetermined voltage value for determining that the power semiconductor switching element is in the normal ON state. In such a case, an overcurrent state may be erroneously detected. In order to prevent such an error, the erroneous-detection prevention circuit for preventing an error in overcurrent state detection is provided.

The erroneous-detection prevention circuit may be configured to increase the delay time such that the output voltage value of the power semiconductor switching element can reach the predetermined voltage value for determining that the power semiconductor switching element is in the normal ON state even when the voltage of the power supply drops. The erroneous-detection prevention circuit may be configured to turn on the power semiconductor switching element within the delay time even when the output voltage drops such that the time required to turn on is prevented from becoming longer than the delay time. Further, the erroneous-detection prevention circuit may be configured to change the voltage value of the signal which is output from the comparator circuit to the filter circuit and represents the comparison result output, i.e. the determination signal which is input from the comparator circuit, in the case where the voltage of the power supply has dropped. Therefore, even in the case where the voltage of the power supply drops during a normal operation, it is possible to prevent an error in overcurrent state detection, and accordingly, it is possible to secure the operation performance.

According to an embodiment of the present invention, a semiconductor device which can prevent an error in overcurrent state detection in order to secure operation performance in the case where the voltage of a power supply drops during a normal operation can be provided.

DETAILED DESCRIPTION OF EMBODIMENTS

Hereinafter, embodiments of the present invention will be described with reference to the drawings. First of all, the basic principle according to an embodiment of the present invention will be described in detail with reference to FIG. 1 to FIG. 3.

(Basic Principle)

First, in order to explain the principle according to an embodiment of the present invention, a basic circuit configuration will be described with reference to FIG. 1.

A semiconductor device according to an embodiment of the present invention is an Intelligent Power Switch (IPS) which can be applied to an electrical system such as the engine, the transmission, the brake, or the like of an electric vehicle.

Figure 1:
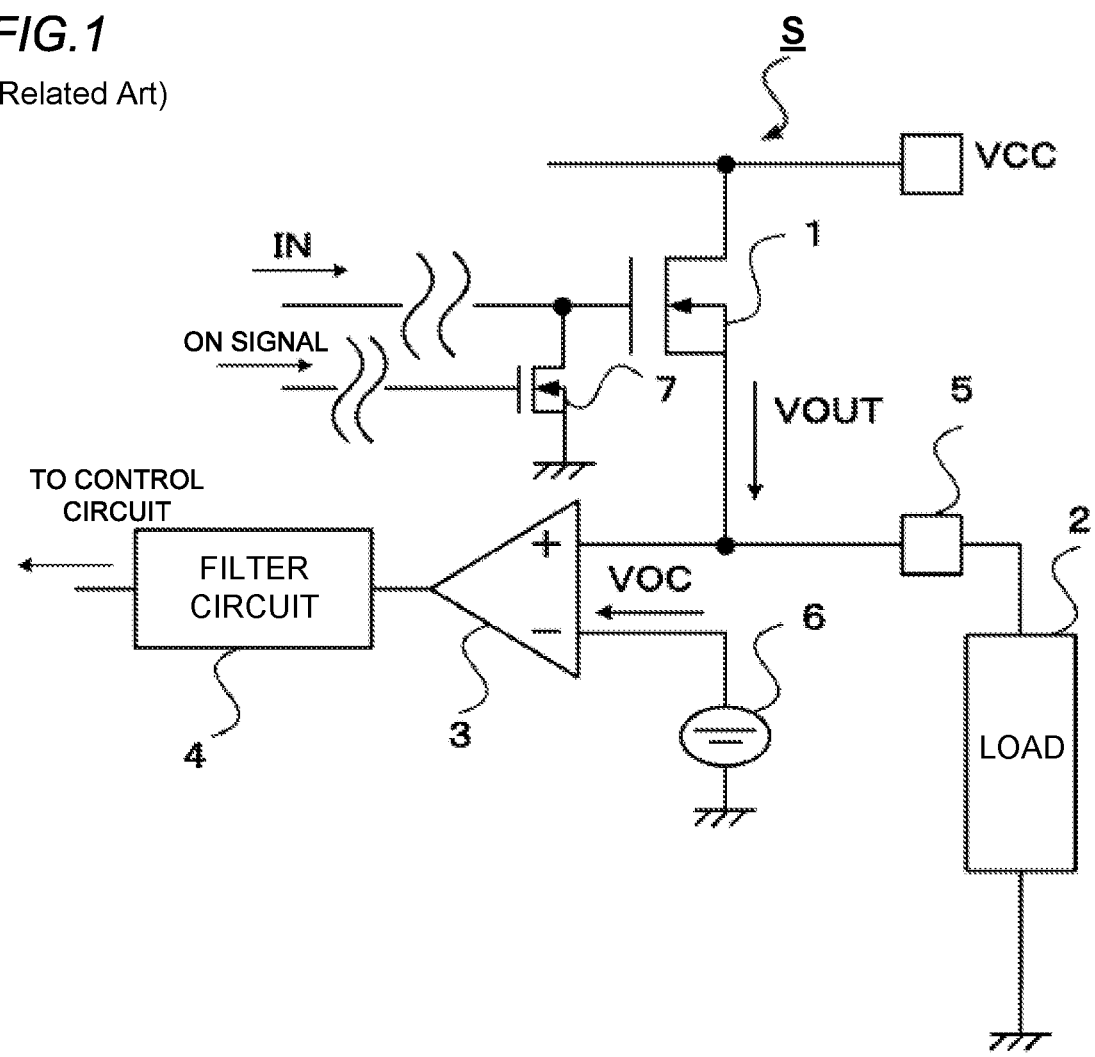
FIG. 1 is a circuit diagram for explaining the basic principle according to an embodiment of the present invention.

As shown in FIG. 1, a semiconductor device S mainly includes a power MOSFET 1 which is a normally-off type N-MOSFET from the fail-safe aspect, a power supply VCC, a comparator 3, a filter circuit 4, and a turn-off MOSFET 7. The power MOSFET 1 is turned on/off in response to a drive signal which is supplied from a gate drive circuit (in a third embodiment to be described below, a gate drive circuit 9 of FIG. 7) to the gate, so that a load 2 included in the above-mentioned electric system is driven with the electric power of the power supply VCC. The gate drive circuit generates the above-mentioned drive signal based on an ON/OFF signal supplied from a control circuit (in the third embodiment to be described below, a control circuit 8 of FIG. 7) such as an ECU or the like of the electric vehicle. The circuit configuration shown in FIG. 1 is an example of a circuit configuration in the case where the power MOSFET 1 is a high-side switch disposed closer to the power supply VCC than the load 2 is, i.e. on the high potential side of the load 2.

The comparator 3 compares the value of the output voltage of the power MOSFET 1 with a threshold appropriately set based on, for example, the rated current of the power MOSFET 1 and the heating temperature of the power MOSFET 1, and if the value of the output voltage is higher than the threshold, the control circuit determines that the power MOSFET 1 is in a normal ON state. Meanwhile, in the case where the value of the output voltage is lower than the threshold, an overcurrent state is determined. In other words, the comparator 3 is a comparator circuit for comparing the output voltage value of the power MOSFET 1 with the threshold in order to make it possible for the control circuit side to determine whether the power MOSFET 1 is in the normal ON state. In this case, the power MOSFET 1 is turned off to prevent the element from being broken by overcurrent, for example. Specifically, the comparator applies an ON signal input from the control circuit to the gate of the turn-off MOSFET 7, so as to turn on the turn-off MOSFET 7 such that the gate of the power MOSFET 1 and an internal ground GND are conducted. As a result, electric charge of the gate of the power MOSFET 1 is drawn out, so that the power MOSFET 1 is turned off.

Connection relations will be described. The drain of power MOSFET 1 is connected to the power supply VCC, and the source thereof is connected to one end of the load 2 via an output terminal 5 and is connected to the non-inverting input terminal of the comparator 3. The other end of the load 2 is grounded. The gate of the power MOSFET 1 is connected to the control circuit via the gate drive circuit and so on, and is also connected to the drain of the turn-off MOSFET 7. The source of the turn-off MOSFET 7 is connected to the internal ground GND, and the gate thereof is connected to the above-mentioned control circuit. The inverting input terminal of the comparator 3 is connected to a reference voltage source 6 configured to output a reference voltage VOC for generating the threshold voltage, and the output terminal thereof is connected to the input terminal of the filter circuit 4. The output terminal of the filter circuit 4 is connected to the above-mentioned control circuit via various circuits for controlling the semiconductor device S.

The gate drive circuit, the control circuit, and so on are mere examples, and arbitrary circuit configurations may be appropriately used as long as it is possible to achieve an object of the present invention.

The operation of the semiconductor device S having the above-described configuration will be described with reference to FIG. 2. As described above, the comparator 3 compares the voltage value of the output voltage VOUT of the power MOSFET 1 with the voltage value of the reference voltage VOC (the above-mentioned threshold), so as to determine whether the output voltage is higher or lower than the reference voltage. This makes it possible for the control circuit side to determine whether the power MOSFET 1 is in an overcurrent state. As a specific example, in the case where the on-resistance of the power MOSFET 1 is 100 mΩ, and an overcurrent detection value is set to 2 A, if the output voltage VOUT is equal to or higher than the reference voltage VOC (=[Voltage of Power Supply VCC]−100 (mΩ)×2 (A)), it is determined that the power MOSFET 1 is in the normal ON state; whereas if the output voltage VOUT is lower than the reference voltage VOC, it is determined that the power MOSFET 1 is in an overcurrent state.

Figure 2:
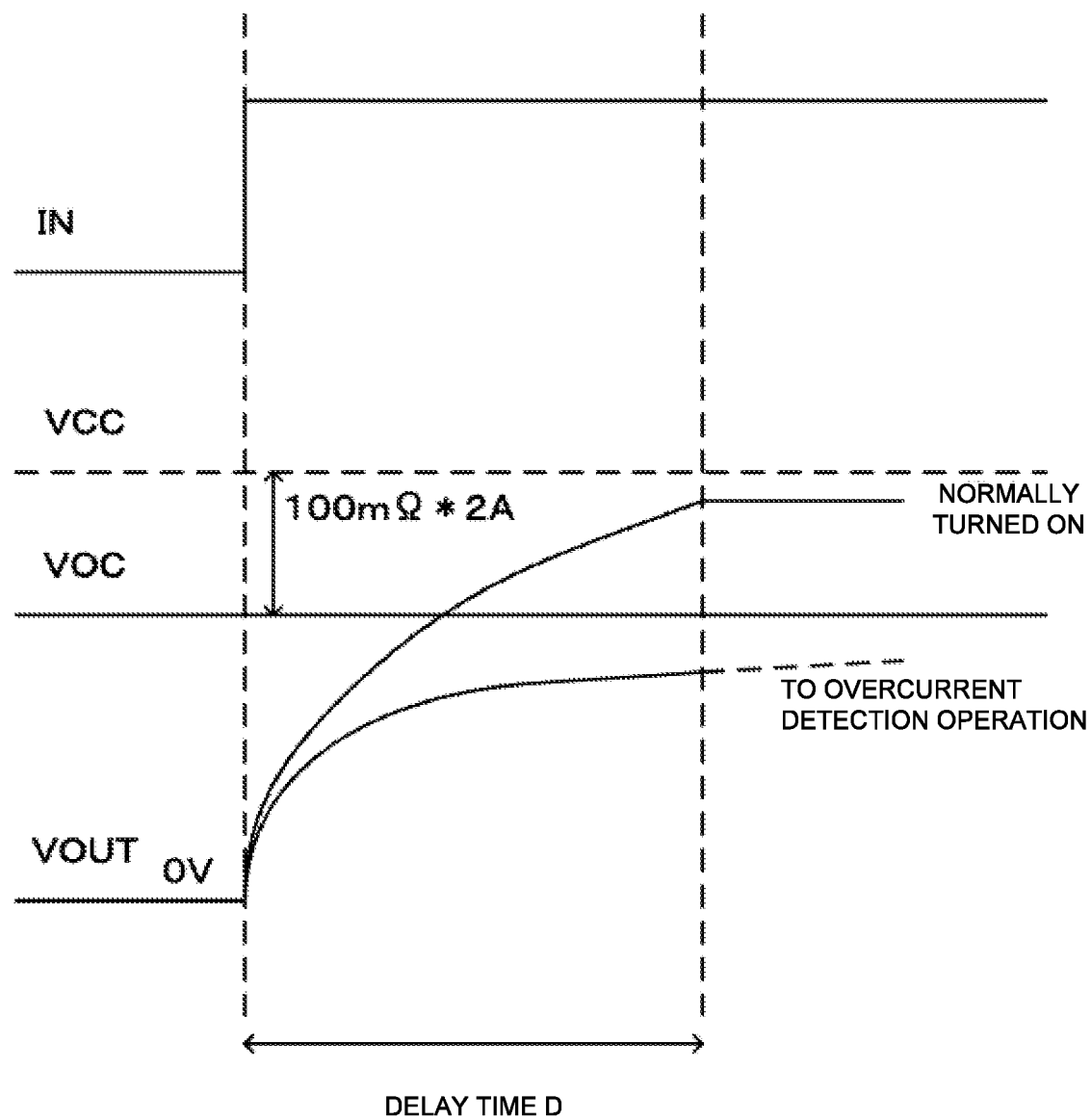
FIG. 2 is a view illustrating output voltage characteristics for explaining the basic principle according to an embodiment of the present invention.

When the power MOSFET 1 is turned on in response to an ON signal IN shown in FIG. 2, at first, the output voltage VOUT is low. In other words, the output voltage does not reach the predetermined voltage value for determining that the power MOSFET is in the normal ON state. In this state, even if the result of comparison between the voltage value of the output voltage VOUT and the voltage value of the reference voltage VOC is output, state determination cannot be properly performed. For this reason, the filter circuit 4 shown in FIG. 1 is provided to set a predetermined time, in other words, a delay time D which is required for the output voltage VOUT to reach the predetermined voltage value for determining that the power MOSFET 1 is in the normal ON state, in the case where the power MOSFET is normally turned on, such that when the delay time D elapses, the comparison result of the comparator 3 is output to the above-mentioned control circuit side, to prevent an error in overcurrent state detection.

In the meantime, even when the semiconductor device is normally operating, the voltage of the power supply VCC may drop for any reason. In this case, a delay occurs in the turn-on operation of the power MOSFET 1. Therefore, as shown by a broken line in FIG. 2, even if the delay time D elapses, the output voltage VOUT does not reach the predetermined voltage value for determining that the power MOSFET 1 is in the normal ON state. If determination on whether the power MOSFET 1 is in an overcurrent state is performed based on the output voltage VOUT in the above-mentioned state by the control circuit side, since the voltage of the power supply VCC has dropped, even though the semiconductor device S is normally operating, an overcurrent state may be erroneously detected.

Figure 3:
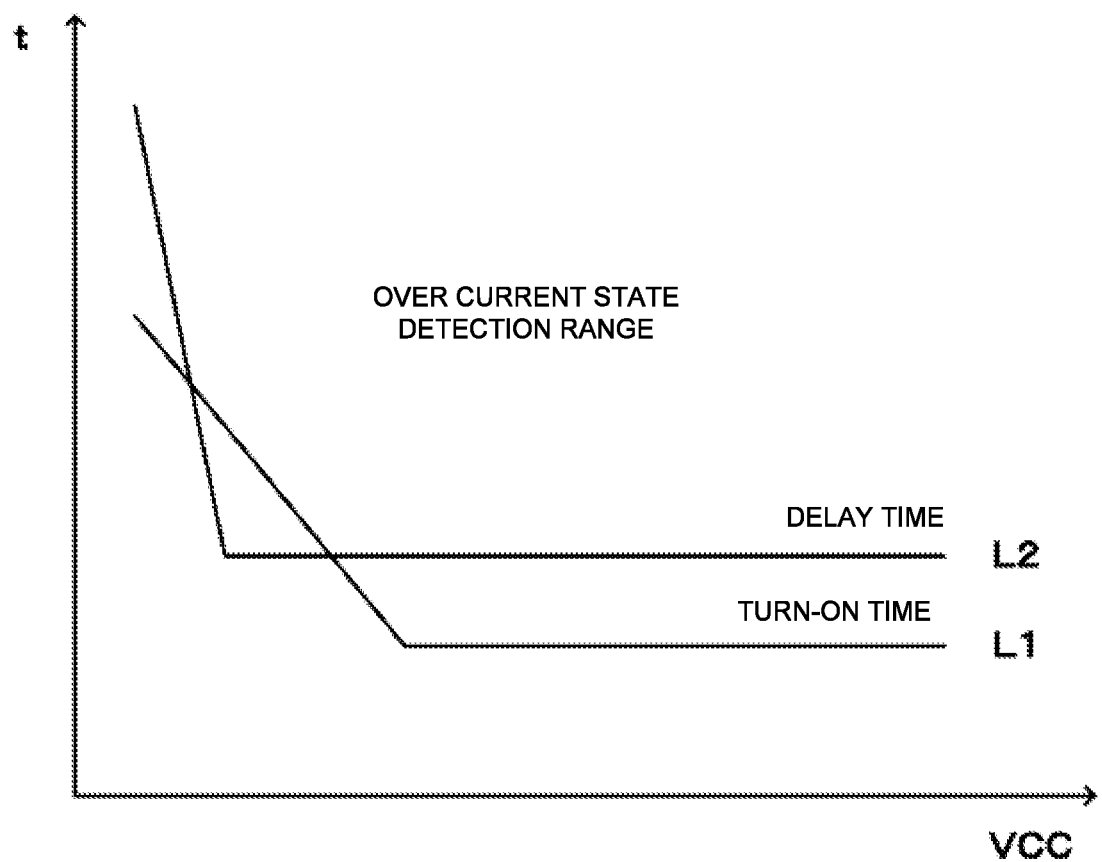
FIG. 3 is a graph illustrating the dependence of the delay time which is set by a filter circuit and the turn-on time on the voltage of a power supply, for explaining the basic principle according to an embodiment of the present invention.

This point will be described in detail from another aspect with reference to the graph of FIG. 3. The graph of FIG. 3 has a vertical axis representing time and a horizontal axis representing the voltage of the power supply VCC and shows the dependence of the delay time which is set by the filter circuit 4 and the turn-on time on the voltage of the power supply. As described above, when the voltage of the power supply VCC drops, the operation performance of the filter circuit 4 deteriorates, and the delay time which is set by the filter circuit 4 increases. Also, when the voltage of the power supply VCC drops, the turn-on time of the power MOSFET 1, i.e. the time required for the output voltage VOUT to reach the predetermined voltage value for determining that the power MOSFET 1 is in the normal ON state increases. For this reason, between a line segment L1 representing the turn-on time depending on the voltage of the power supply VCC and a line segment L2 representing the delay time which is set by the filter circuit 4 and depends on the voltage of the power supply VCC, an overlap occurs. If it is possible to change the positional relation between those line segments such that the overlap is suppressed, even in the case where the voltage of the power supply VCC drops during a normal operation, it is possible to secure the operation performance of the semiconductor device S. An embodiment of the present invention uses circuit configurations capable of suppressing such an overlap to secure the operation performance of the semiconductor device S. In other words, even in the case where the voltage of the power supply VCC drops, an embodiment of the present invention changes the positional relation between the line segment L1 representing the turn-on time of the power MOSFET 1 and the line segment L2 representing the delay time which is set by the filter circuit 4 such that the two line segments do not intersect. Also, in the case where the voltage of the power supply VCC drops, an embodiment of the present invention changes the voltage value of the output signal of the comparator 3 representing the above-mentioned comparison result, so as to prevent an error in overcurrent state detection which is performed on the control circuit side. Hereinafter, embodiments implementing such operations will be described in detail.

(First Embodiment)

Figure 4A:
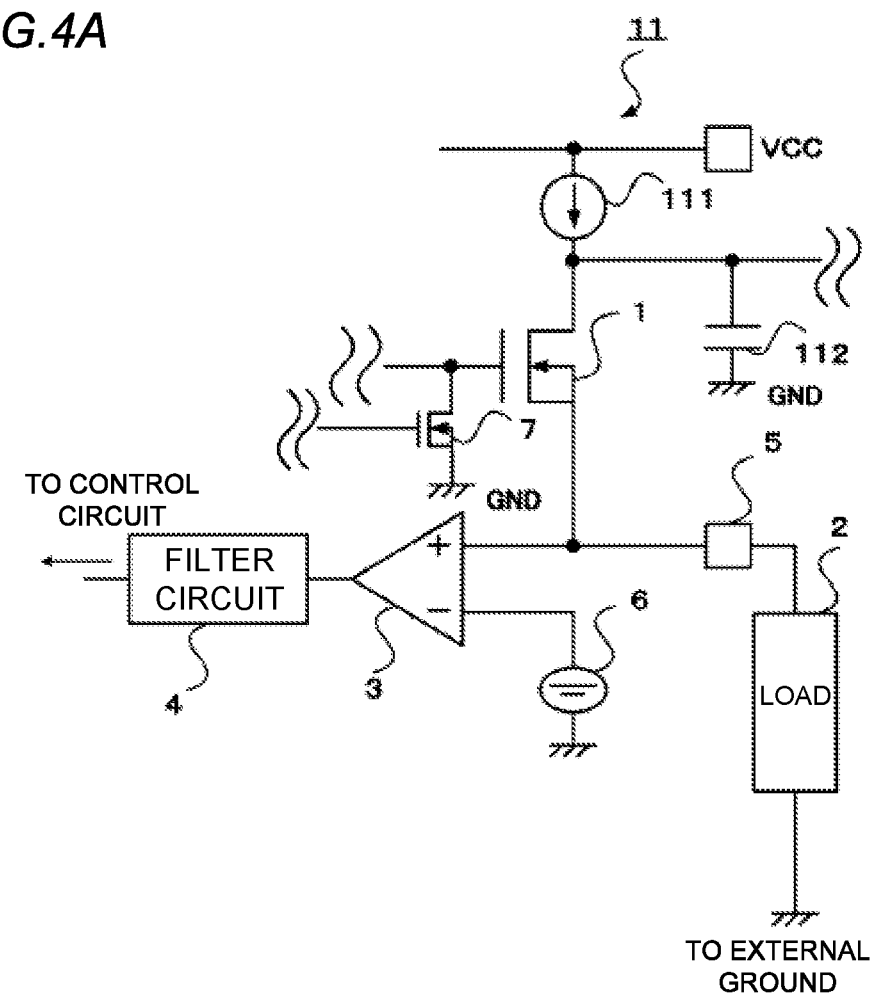
FIG. 4A is a circuit diagram illustrating a circuit configuration according to a first embodiment of the present invention.

A first embodiment will be described with reference to FIG. 4A to FIG. 5B. The first embodiment relates to an erroneous-detection prevention circuit which can prevent the line segment L2 of FIG. 3 representing the delay time from overlapping the line segment L1 representing the turn-on time in the case where the voltage of the power supply VCC drops during a normal operation. In other words, in the case where the voltage of the power supply VCC drops, the erroneous-detection prevention circuit increases the delay time which is set by the filter circuit 4 and is required for the output voltage of the power MOSFET 1 to reach the predetermined voltage value for determining that the power MOSFET 1 is in the normal ON state, so as to prevent an error in overcurrent state detection. Hereinafter, this circuit configuration will be referred to as a first erroneous-detection prevention circuit 11. As shown in FIG. 4A, the first erroneous-detection prevention circuit 11 includes a constant-current source 111 and a capacitor 112. The other components are identical to the above-mentioned components, and therefore, they are not shown in the drawings and will not be described below.

The constant-current source 111 is, for example, a circuit including a MOSFET, and the input terminal thereof is connected to the power supply VCC, and the output terminal thereof is connected to the drain of the power MOSFET 1. The capacitor 112 is an element for stabilizing the voltage of the power supply VCC, and one end of the capacitor is connected between the other end of the constant-current source 111 and the drain of the power MOSFET 1, and the other end of the capacitor is connected to the internal ground GND.

Figure 4B:
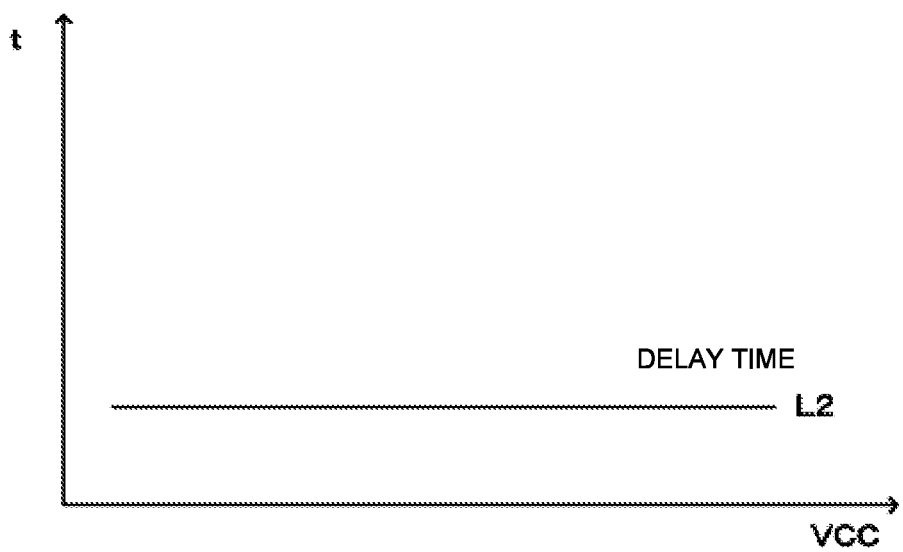
FIG. 4B is a graph illustrating a characteristic of that circuit configuration.

The first erroneous-detection prevention circuit 11 contributes to stabilization of the delay time which is set by the filter circuit 4 as shown in FIG. 4B. In other words, it is possible to reduce the dependence of the delay time on the magnitude of the voltage of the power supply VCC.

Figure 5A:
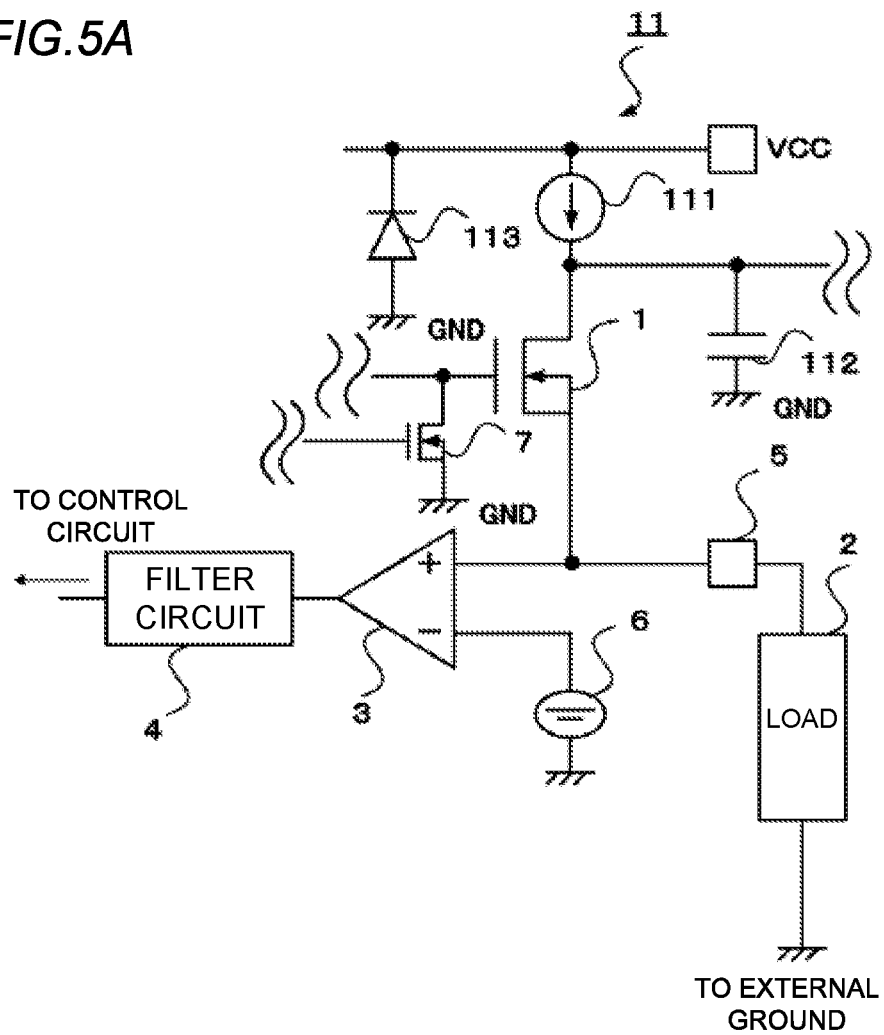
FIG. 5A is a circuit diagram illustrating a circuit configuration according to the first embodiment of the present invention.
Figure 5B:
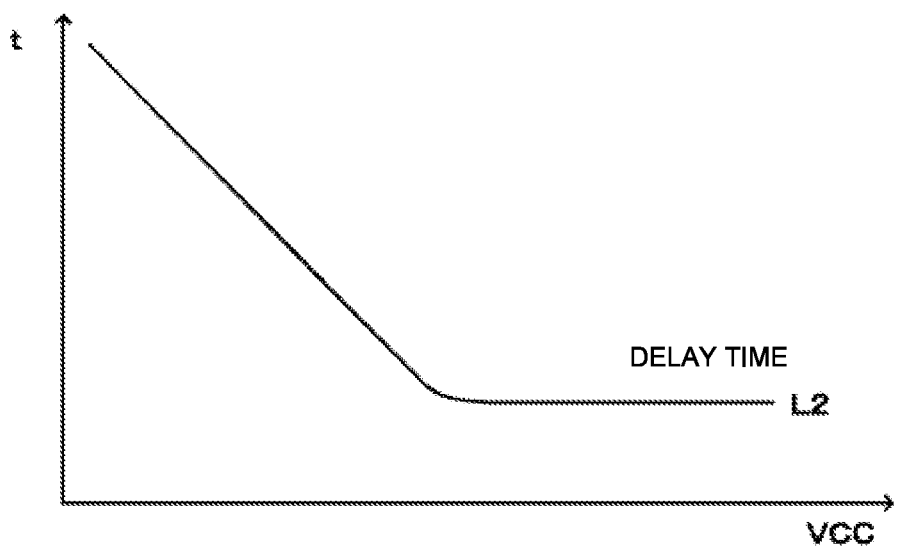
FIG. 5B is a graph illustrating a characteristic of that circuit configuration.

The first erroneous-detection prevention circuit 11 may further include a diode 113 including a cathode connected to the power supply VCC and the input terminal of the constant-current source 111, and an anode connected to the internal ground GND, as shown in FIG. 5A. In this configuration, the diode 113 clamps the voltage of the power supply VCC. Therefore, the diode stabilizes the delay time which is set by the filter circuit 4, in cooperation with the configuration shown in FIG. 4A. In the case where the voltage of the power supply VCC drops, it is possible to increase the delay time which is set by the filter circuit 4, as shown in FIG. 5B, by the voltage clamping of the diode 113. In other words, the first erroneous-detection prevention circuit 11 shifts the line segment L2 of the graph of FIG. 3 representing the delay time which is set by the filter circuit 4 to the right side of FIG. 3 with respect to the line segment L1 representing the turn-on time, so as to prevent the two line segments from overlapping. In other words, the first erroneous-detection prevention circuit 11 changes the delay time which is set by the filter circuit 4, such that the delay time always becomes longer than the turn-on time of the power MOSFET 1 even in the case where the voltage of the power supply VCC drops. In this way, in the case where the voltage of the power supply VCC drops for any reason during a normal operation, the first erroneous-detection prevention circuit 11 increases the delay time which is set by the filter circuit 4, such that during the delay time, the output voltage VOUT of the power MOSFET 1 can be raised to the predetermined voltage value for determining that the power MOSFET 1 is in the normal ON state. Therefore, even in the case where the voltage of the power supply VCC drops during a normal operation, it is possible to prevent an error in overcurrent state detection, so as to secure the operation performance of the semiconductor device S.

Also, since the first erroneous-detection prevention circuit 11 has a comparatively simple configuration, for example, there is an advantage that it is possible to achieve the above-mentioned effect without significantly changing the layout of the semiconductor device S.

(Second Embodiment)

Figure 6:
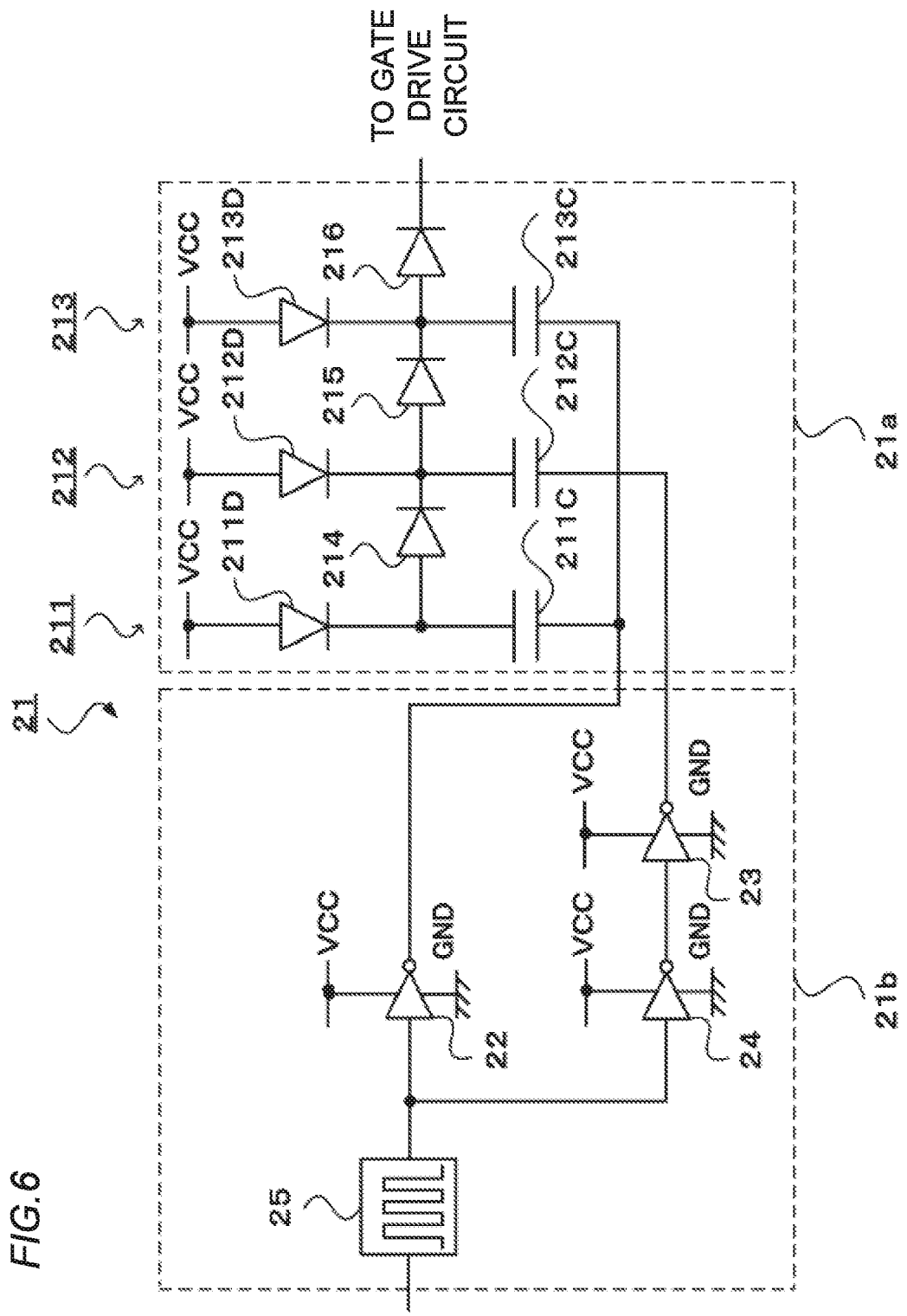
FIG. 6 is a circuit diagram illustrating a circuit configuration according to a second embodiment of the present invention.

A second embodiment will be described in detail with reference to FIG. 6. The second embodiment relates to a second erroneous-detection prevention circuit 21 for shifting the line segment L1 of FIG. 3 representing the turn-on time to the left side of FIG. 3, so as to suppress the line segment L1 from overlapping the line segment L2 representing the delay time which is set by the filter circuit 4. In other words, even in the case where the voltage of the power supply VCC drops, the second erroneous-detection prevention circuit 21 turns on the power MOSFET 1 within the delay time set by the filter circuit 4, so as to prevent an error in overcurrent state detection without increasing the turn-on time of the power MOSFET 1. The second erroneous-detection prevention circuit 21 is a so-called charge pump and raises the voltage of the power supply VCC even in the case where the corresponding voltage has dropped, and applies the raised voltage to the gate of the power MOSFET 1. Hereinafter, for ease of explanation, the second erroneous-detection prevention circuit 21 will be referred to as the charge pump circuit 21.

For example, in the case of applying the IPS which is the semiconductor device S according to an embodiment of the present invention as a high side IPS in the electric system of the electric vehicle, in order to completely turn on the power MOSFET 1 which is an N-MOSFET, from the viewpoint of the circuit configuration, a voltage higher than that of the drain of the power MOSFET 1 is required. The voltage of the drain is the voltage of the power supply VCC and is the highest voltage in the circuit. For this reason, in order to obtain a voltage higher than the voltage of the power supply VCC, in the present embodiment, the charge pump circuit 21 is used.

(Configuration)

The charge pump circuit 21 will be further described. The charge pump circuit 21 includes a charge pump section 21a and an oscillation section 21b. The charge pump section 21a includes first to third series circuits 211 to 213 each of which is a series circuit of a diode and a capacitor, diodes 214 and 215 each of which connects two neighboring series circuits of the series circuits 211 to 213, and a diode 216 which applies the voltage output by the charge pump circuit 21 to the gate drive circuit (not shown) for turning on/off the power MOSFET 1 in response to the control signal of the ECU or the like of the electric vehicle. The series circuit 211 includes a diode 211D and a capacitor 211C, and the series circuit 212 includes a diode 212D and a capacitor 212C, and the series circuit 213 includes a diode 213D and a capacitor 213C. The anodes of the diodes 211D to 213D are connected to the power supply VCC, and the cathode of the diode 211D is connected to one end of the capacitor 211C, and the cathode of the diode 212D is connected to one end of the capacitor 212C, and the cathode of the diode 213D is connected to one end of the capacitor 213C.

The anode of the diode 214 is connected between the cathode of the diode 211D and the one end of the capacitor 211C, and the cathode thereof is connected between the cathode of the diode 212D and the capacitor 212C.

The anode of the diode 215 is connected between the cathode of the diode 212D and the one end of the capacitor 212C, and the cathode thereof is connected between the cathode of the diode 213D and the capacitor 213C.

The anode of the diode 216 is connected between the cathode of the diode 213D and the one end of the capacitor 213C, and the cathode thereof is connected to the gate of the power MOSFET 1 via the gate drive circuit and so on.

The oscillation section 21b includes first to third inverters (NOT gates) 22 to 24 and an oscillator 25. The output terminal of the first inverter 22 is connected to the other end of the capacitor 211C of the first series circuit 211 and the other end of the capacitor 213C of the third series circuit 213, and the output terminal of the second inverter 23 is connected to the other end of the capacitor 212C of the second series circuit 212. The output terminal of the third inverter 24 is connected to the input terminal of the second inverter 23.

Each of the input terminals of the first and third inverters 22 and 24 is connected to the output terminal of the oscillator 25.

The oscillator 25 generates a high-level or low-level pulse signal, for example, a Pulse Frequency Modulation (PEM) pulse, based on the ON/OFF signal input from the control circuit such as the ECU of the electric vehicle, and supplies the pulse signal to the first and third inverters 22 and 24.

(Operations and Effects)

Operations and effects of the charge pump circuit 21 having the above-described configuration will be described. In the oscillation section 21b, in the case where the pulse signal which is output from the oscillator 25 is at the high level, the first inverter 22 outputs a low-level signal. As a result, the power supply VCC and the internal ground GND are conducted via the capacitor 211C, so that the capacitor 211C is charged with the current flowing from the power supply VCC via the first diode 211D. The capacitor 213C is charged with similar operation.

Next, if the pulse signal output which is output from the oscillator 25 is at the low level, the third inverter 24 outputs a high-level signal, and if the second inverter 23 receives that signal, it outputs a low-level signal. As a result, the power supply VCC and the internal ground GND are conducted via the capacitor 212C, so that the capacitor 212C is charged with the current flowing from the power supply VCC via the diode 212D. Meanwhile, the first inverter 22 outputs the high-level signal. As a result, the electric charge stored in the capacitor 211C is superimposed on the voltage of the power supply VCC, so as to be supplied to the gate drive circuit (not shown) via the diodes 214 to 216. Similarly, the electric charge stored in the capacitor 213C is output to the gate drive circuit via the diode 216.

If the pulse signal which is output from the oscillator 25 becomes the high level again, the electric charge stored in the capacitor 212C is superimposed on the voltage of the power supply VCC, so as to be supplied to the gate drive circuit via the diodes 215 and 216. Also, as described above, the capacitor 211C and the capacitor 213C are charged again.

By repeating the charging and discharging of the capacitors 211C to 213C, the electric charge released from the capacitor 211C and so on is superimposed on the voltage of the power supply VCC and is applied to the gate of the power MOSFET 1 via the gate drive circuit and so on. In other words, the charge pump circuit 21 changes the turn-on time such that the turn-on time of the power MOSFET 1 always becomes shorter than the delay time which is set by the filter circuit 4 even in the case where the voltage of the power supply VCC drops. In other words, the charge pump circuit changes the turn-on time such that the delay time always becomes longer than the turn-on time over the whole voltage range of the power supply VCC. Therefore, even in the case where the voltage of the power supply VCC drops, the diode operation of the power MOSFET 1 is improved. As a result, an error in detecting an overcurrent state of the semiconductor device S can be prevented, and accordingly, the operation performance can be secured.

Also, since external components which are required as components of the charge pump circuit 21 are only the capacitors 211C to 213C, there is an advantage that it is easy to make the charge pump circuit 21 space-saving and design the charge pump circuit.

Further, the number of capacitors such as the capacitor 211C for the charge pump circuit 21 is arbitrary. For example, it is preferable to appropriately design the number of capacitors such as the capacitor 211C, and the capacities of them such that the output voltage of the charge pump circuit 21 becomes a desired voltage value and does not exceed the gate breakdown voltage of the power MOSFET 1.

(Third Embodiment)

Figure 7:
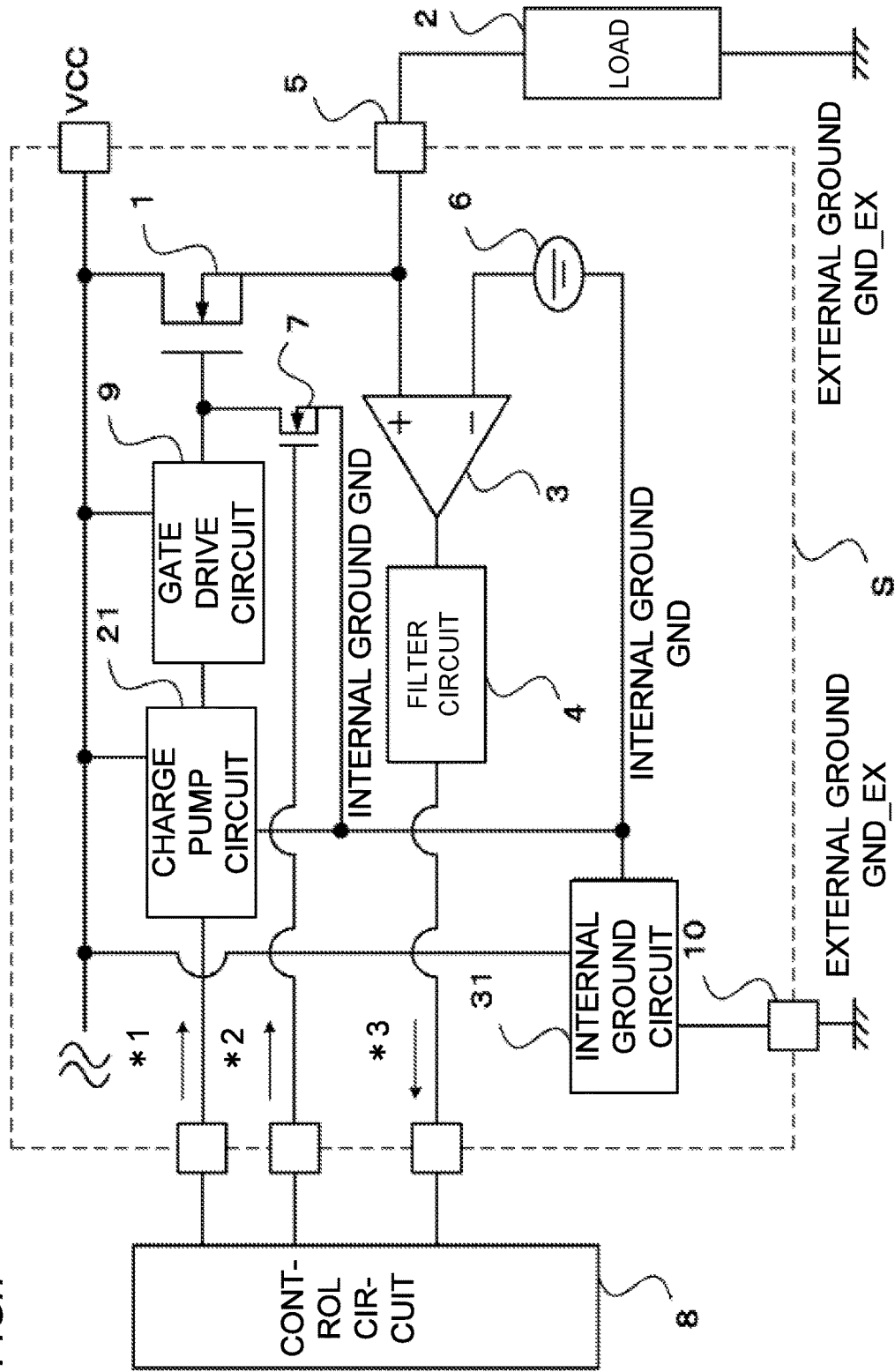
FIG. 7 is a circuit diagram illustrating a circuit configuration according to a third embodiment of the present invention.
Figure 8:
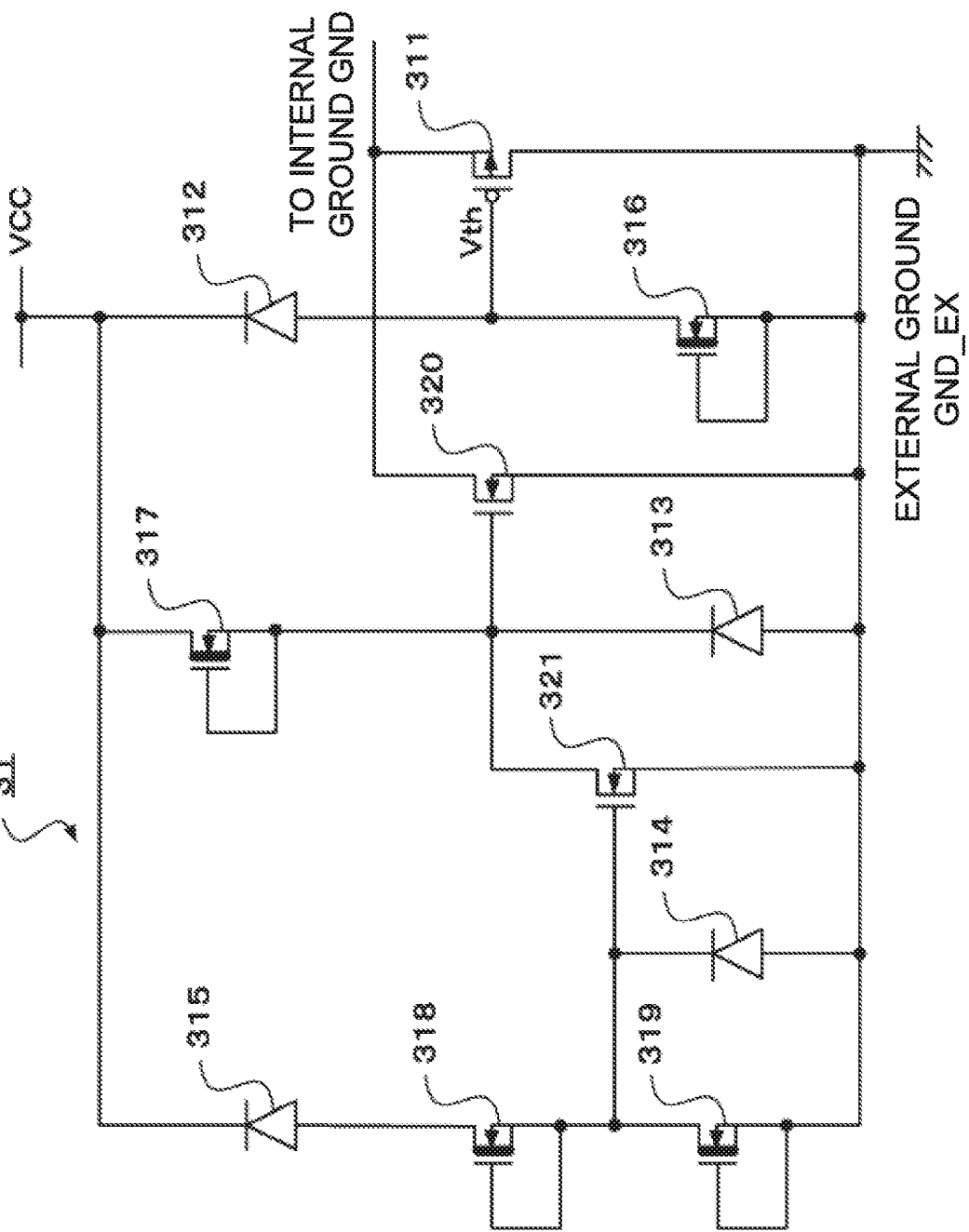
FIG. 8 is a circuit diagram illustrating a circuit configuration according to the third embodiment of the present invention.

A third embodiment will be described in detail with reference to FIG. 7 and FIG. 8. The third embodiment relates to a third erroneous-detection prevention circuit 31 which can improve the capability of the charge pump circuit 21 (the second erroneous-detection prevention circuit) of the second embodiment to secure the operation performance of the semiconductor device S even in the case where the voltage of the power supply VCC drops. Hereinafter, this third erroneous-detection prevention circuit 31 will be referred to as the internal ground circuit 31. As shown in FIG. 7, the internal ground circuit 31 is connected between the charge pump circuit 21, more specifically, the internal ground GND of the first to third inverters 22 to 24 shown in FIG. 6, and an external ground, and reduces the potential of the internal ground GND to about 0 V, so as to improve the voltage raising operation of the charge pump circuit 21. An example of the configuration of the internal ground circuit 31 is shown in FIG. 8. It is noted that the circuit configuration shown in FIG. 7 is merely for facilitating the understanding of the present invention, and for practical purposes, besides the components shown in the drawings, various circuits for controlling the semiconductor device S, such as a level shift circuit and so on, may be included, but may not be shown in the drawings in order to facilitate understanding of the present invention.

(Configuration)

As shown in FIG. 8, the internal ground circuit 31 includes a first MOSFET 311, first to fourth diodes 312 to 315, second to fifth MOSFETs 316 to 319, and sixth and seventh MOSFETs 320 and 321.

The first MOSFET 311 is, for example, an enhancement type (a normally-off type) P-MOSFET. The second to fifth MOSFETs 316 to 319 are, for example, depletion type (a normally-on type) N-MOSFETs. The sixth and seventh MOSFETs 320 and 321 are, for example, enhancement type N-MOSFETs.

Connection relations will be described in detail.

The first MOSFET 311 has such a connection relation that it potentially forms the internal ground GND with reference to the power supply VCC and operates as a source follower. Specifically, the source of the first MOSFET 311 is connected to the internal ground GND shown in FIG. 6 and the drain of the sixth MOSFET 320, and the drain thereof is connected to an external ground GND_EX via a ground terminal 10 shown in FIG. 7, and the gate thereof is connected to the anode of the first diode 312 and the drain of the second MOSFET 316. The cathode of the first diode 312 is connected to the power supply VCC.

The source of the second MOSFET 316 is connected to the external ground GND_EX via the ground terminal 10 of FIG. 7, and the gate thereof is connected to the source thereof. The drain of the third MOSFET 317 is connected to the power supply VCC, and the source thereof is connected to the cathode of the second diode 313, and the gate thereof is connected to the source thereof. The drain of the fourth MOSFET 318 is connected to the anode of the fifth diode 315, and the source thereof is connected to the drain of the fifth MOSFET 319, and the gate thereof is connected to the source thereof. The source of the fifth MOSFET 319 is connected to the external ground GND_EX via the ground terminal 10 of FIG. 7, and the gate thereof is connected to the source thereof.

The drain of the sixth MOSFET 320 is connected to the drain of the first MOSFET 311 and the internal ground GND, and the source thereof is connected to the external ground GND_EX via the ground terminal 10 of FIG. 7, and the gate thereof is connected between the source of the third MOSFET 317 and the cathode of the second diode 313. The drain of the seventh MOSFET 321 is connected to the gate of the sixth MOSFET 320, and the source thereof is connected to the external ground GND_EX via the ground terminal 10 of FIG. 7, and the gate thereof is connected between the source of the fourth MOSFET 318 and the drain of the fifth MOSFET 319.

The anode of the second diode 313 is connected to the external ground GND_EX via the ground terminal 10 of FIG. 7. The anode of the third diode 314 is connected to the external ground GND_EX via the ground terminal 10 of FIG. 7, and the cathode thereof is connected to the gate of the seventh MOSFET 321. The cathode of the fourth diode 315 is connected to the power supply VCC.

(Operations and Effects)

Operations and effects of the internal ground circuit 31 according to the present embodiment will be described.

In order to improve the capability of the charge pump circuit 21, an internal ground circuit may be provided. In this case, for example, in the case where the internal ground circuit 31 includes only the first MOSFET 311, the first diode 312, and the second. MOSFET 316, if the first and fourth diodes 312 and 315 and so on are configured to clamp the voltage at 5 V, even if the voltage of the power supply VCC drops, the potential of the internal ground GND is unlikely to become about 0 V. Specifically, since the first MOSFET 311 is a P-MOSFET which is turned on if the potential of the gate is lower than that of the source, and the source thereof is connected to the internal ground GND, in the case where the potential of the internal ground is lower than the potential of the gate, the first MOSFET 311 is turned off, so that the internal ground GND and the external ground GND_EX are not conducted via the first MOSFET 311. For this reason, the potential of the internal ground GND is unlikely to become lower than the threshold voltage Vth between the gate and source of the first MOSFET 311. Therefore, the amplitude of the input signal to the charge pump circuit 21, for example, the signal from the inverter 22 shown in FIG. 6 may decrease, and accordingly, the voltage raising operation of the charge pump circuit 21 may be delayed.

However, according to the circuit configuration of the present embodiment, in the case where the voltage of the power supply VCC drops to a voltage below 5 V, the sixth MOSFET 320 and so on draw out the electric charge of the internal ground GND, so that the potential of the internal ground GND decreases to about 0 V. Therefore, even in the case where the voltage of the power supply VCC drops during a normal operation, since the amplitude of the input signal to the charge pump circuit 21 is improved, the turn-on operation of the power MOSFET 1 is improved. Accordingly, even in the case where the voltage of the power supply VCC drops during a normal operation, it is possible to prevent an error in overcurrent state detection.

(Fourth Embodiment)

In the first to third embodiments described above, an error in overcurrent state detection is prevented by changing the delay time which is set by the filter circuit 4 or the turn-on time of the power MOSFET 1. However, it is also possible to prevent an error in overcurrent state detection by changing the voltage value of a determination signal which is an input signal from the comparator 3 to the filter circuit 4, in other words, a signal representing the comparison result of the comparator 3, and is a signal to be used on the control circuit side to detect and determine whether the power MOSFET 1 is in the normal ON state. Hereinafter, a fourth erroneous-detection prevention circuit for changing the voltage value of the determination signal, according to the present embodiment, will be described in detail with reference to FIG. 9 and FIG. 10.

Figure 9:
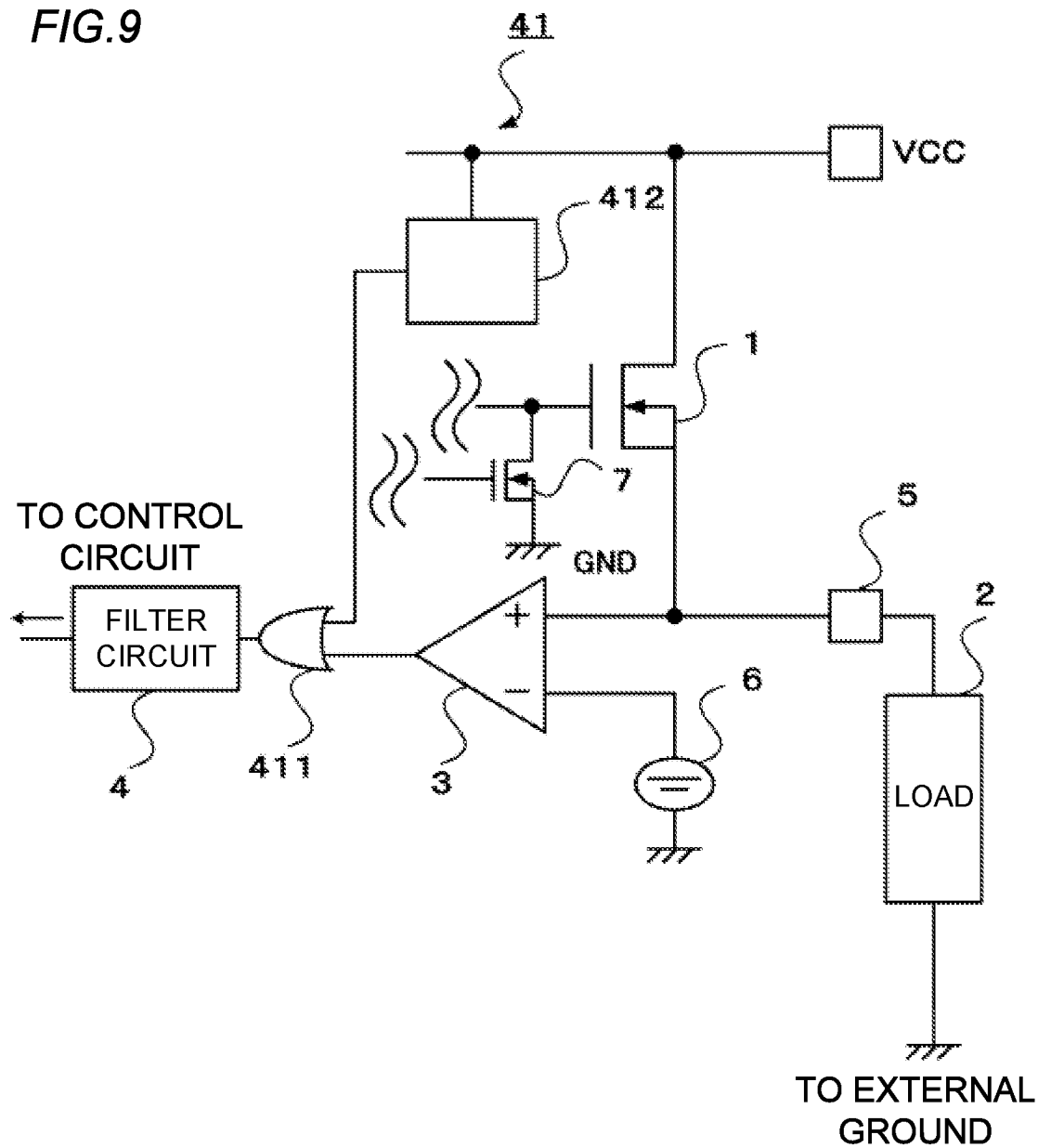
FIG. 9 is a circuit diagram illustrating a circuit configuration according to a fourth embodiment of the present invention.

As shown in FIG. 9, a fourth erroneous-detection prevention circuit 41 includes an OR gate 411 and a power-supply voltage drop detection circuit 412.

The OR gate 411 is disposed between the filter circuit 4 and the comparator 3, and includes one input terminal connected to the output terminal of the power-supply voltage drop detection circuit 412, and the other input terminal connected to the output terminal of the comparator 3. The output terminal of the OR gate 411 is connected to the input terminal of the filter circuit 4. The OR gate 411 outputs a signal having a level according to the output signal of the power-supply voltage drop detection circuit 412 and the output signal of the comparator 3, to the filter circuit 4.

Figure 10:
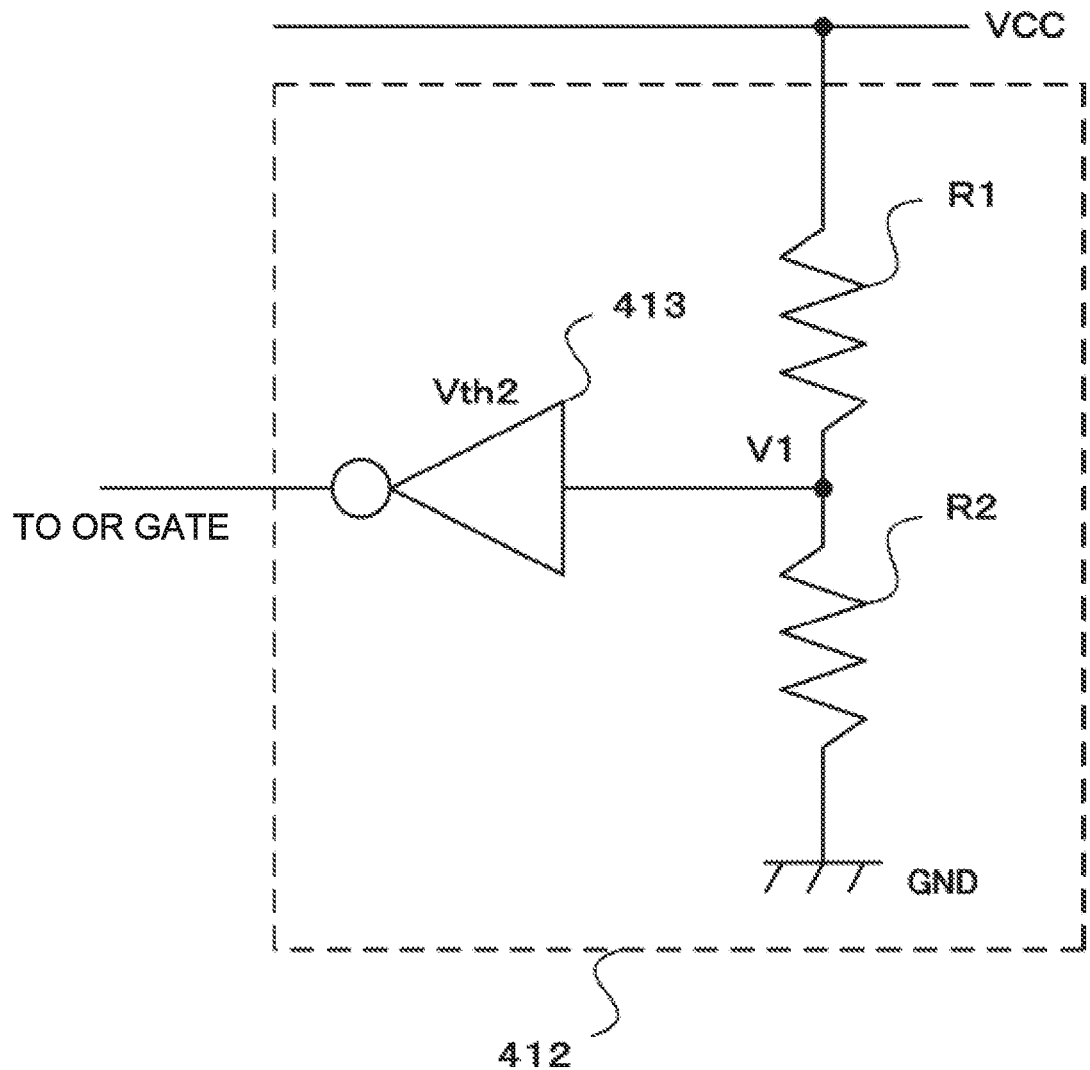
FIG. 10 is a circuit diagram illustrating an example of the configuration of a power-supply voltage drop detection circuit shown in FIG. 9.

The power-supply voltage drop detection circuit 412 detects a drop in the voltage of the power supply VCC. FIG. 10 shows an example of the power-supply voltage drop detection circuit 412. As shown in FIG. 10, the power-supply voltage drop detection circuit 412 includes a pair of resistors R1 and R2 connected in series, and a NOT gate (an inverter) 413 including the input terminal connected to the contact point between the resistor R1 and the resistor R2, and the output terminal connected to the OR gate 411. One end of each of the resistors R1 and R2 is connected to the power supply VCC, and the other end is connected to the internal ground GND.

The voltage V1 on the center point between the resistors R1 and R2 caused by voltage division of the resistors, in other words, the voltage V1 which is applied to the input terminal of the inverter 413 is calculated by V1=VCC×(R2/(R1+R2)). In the inverter 413, a threshold Vth2 is set, and this threshold Vth2 is appropriately set such that it is possible to detect a drop in the voltage of the power supply VCC. Specifically, the threshold is set such that in the case where the voltage V1 is higher than the threshold Vth2, the inverter 413 outputs a low-level signal; whereas in the case where the voltage V1 is lower than the threshold Vth2, the inverter 413 outputs a high-level signal.

The operation of the fourth erroneous-detection prevention circuit 41 will be described. Hereinafter, the operation of the fourth erroneous-detection prevention circuit 41 in the case where the voltage of the power supply VCC drops will be described. If the voltage of the power supply VCC drops, the low-level signal (the above-mentioned determination signal) from the comparator 3 is input to the other input terminal of the OR gate 411, and since the voltage V1 is lower than the threshold Vth2, the high-level signal from the inverter 413 is input to the one input terminal of the OR gate 411.

Based on the low-level signal input from the comparator 3 and the high-level signal input from the inverter 413, the OR gate 411 outputs the high-level signal to the filter circuit 4. Here, if the OR gate 411 does not exist, the low-level signal from the comparator 3 is input to the filter circuit 4. However, in the present embodiment, by the OR gate 411 disposed between the filter circuit 4 and the comparator 3, the high-level signal is input to the filter circuit 4. As a result, the filter circuit 4 outputs the high-level signal. Therefore, an error in overcurrent state detection can be prevented. In other words, the voltage value of the determination signal output from the comparator 3 and representing the comparison result is changed, so that an error in overcurrent state detection which is performed on the control circuit side can be prevented.

In the case where the power MOSFET 1 is not in an actual overcurrent state, when the voltage of the power supply VCC temporarily drops, the comparator 3 outputs the low-level signal to the other input terminal of the OR gate 411. In this state, if the voltage of the power supply VCC recovers, the inverter 413 outputs the low-level signal to the one input terminal of the OR gate 411. In this case, the OR gate 411 outputs the low-level signal to the filter circuit 4. However, after the delay time set by the filter circuit 4, the comparator 3 outputs the high-level signal to the other input terminal of the OR gate 411, and the inverter 413 outputs the low-level signal to the one input terminal of the OR gate 411. As a result, the OR gate 411 outputs the high-level signal to the filter circuit 4. Therefore, it is possible to prevent an error in overcurrent state detection which is performed on the control circuit side, and thus the operation performance of the semiconductor device S can be secured.

Also, in the case of using the fourth erroneous-detection prevention circuit 41, for example, it is preferable to use a circuit configuration having a sense MOSFET (not shown) for detecting actual overcurrent states, separately from the power MOSFET 1.

(Other Embodiments)

Although the embodiments of the present invention have been described, the present invention is not limited to the above-described embodiments, and a variety of applications and modifications can be made without departing from the technical scope of the present invention. For example, the circuit configurations shown in the first to third embodiments are merely examples, and other circuit configurations may be used as long as the positional relation between the line segment representing the delay time of the filter circuit 4 depending on the magnitude of the voltage of the power supply VCC and the line segment representing the turn-on time of the power MOSFET 1 depending on the magnitude of the voltage of the power supply VCC can be changed so as not to overlap.

Also, in the above-described embodiments, the case where the power semiconductor switching element is the power MOSFET 1 has been described as an example. However, the present invention is not limited thereto. For example, in an application which requires power capacity larger than that of the power MOSFET 1 but does not necessarily need a switching speed higher than that of the power MOSFET 1, in place of the power MOSFET 1, an IGBT may be used.

Also, as long as it is possible to achieve an object of the present invention, the first to fourth embodiments may be appropriately combined within a range in which that specifications and so on required for an actual application are satisfied.

The invention claimed is:

1. A semiconductor device which includes a power semiconductor switching element configured to drive a load with electric power from a power supply by switching, and which is configured to output a determination signal for detecting whether the power semiconductor switching element is in a normal ON state to a control circuit configured to perform the detection, the semiconductor device comprising:
    a comparator circuit configured to compare a value of an output voltage of the power semiconductor switching element with a threshold representing an overcurrent state of the power semiconductor switching element and output a comparison result as the determination signal;
    a filter circuit provided on an output side of the comparator circuit so as to output the determination signal to the control circuit after a delay time required for the output voltage of the power semiconductor switching element to reach a predetermined voltage value for determining that the power semiconductor switching element is in the normal ON state after the power semiconductor switching element is turned on; and
    an erroneous-detection prevention circuit configured to change a turn-on time of the power semiconductor switching element, the delay time, or a voltage value of the determination signal when a voltage of the power supply drops in a case where the power semiconductor switching element is normally turned on, so as to prevent an error in overcurrent state detection which is performed by the control circuit,
wherein the erroneous-detection prevention circuit includes
    a charge pump circuit configured to raise a voltage to be applied to a gate of the power semiconductor switching element, and
    an internal ground circuit provided between an internal ground of the charge pump circuit and an external ground of the semiconductor device and configured to draw electric charge of the internal ground to the external ground when the voltage of the power supply drops.

2. The semiconductor device according to claim 1, wherein the erroneous-detection prevention circuit includes:
    a power-supply voltage drop detection circuit connected to the power supply and configured to detect a drop in the voltage of the power supply; and
    an OR gate including an output terminal connected to the filter circuit, one input terminal connected to the power-supply voltage drop detection circuit, and another input terminal connected to an output terminal of the comparator circuit.

3. The semiconductor device according to claim 1, wherein the erroneous-detection prevention circuit is configured to change the delay time or the turn-on time such that the delay time always becomes longer than the turn-on time.

4. The semiconductor device according to claim 3, wherein the erroneous-detection prevention circuit includes:
    a constant-current source provided between the power supply and the power semiconductor switching element; and
    a capacitor including one end connected between the constant-current source and the power semiconductor switching element and another end which is grounded.

5. The semiconductor device according to claim 4, wherein the erroneous-detection prevention circuit further includes:
    a diode including a cathode connected to the power supply and an anode which is grounded, and
wherein the diode is configured to clamp the voltage of the power supply.

6. The semiconductor device according to claim 1, wherein the power semiconductor switching element is a power N-MOSFET disposed on a high potential side of the load, and
wherein the charge pump circuit is configured to raise the voltage to be applied to the gate of the power semiconductor switching element such that the turn-on time of the power semiconductor switching element becomes shorter than the delay time.

7. The semiconductor device according to claim 6, wherein the internal ground circuit is configured to draw electric charge of the internal ground to the external ground when the voltage of the power supply drops, so as to decrease a potential of the internal ground to stabilize an output of the charge pump circuit.

8. The semiconductor device according to claim 7, wherein the internal ground circuit includes:
    a diode including a cathode connected to the power supply;

a P-MOSFET including a source connected to the internal ground, a drain connected to the external ground, and a gate connected to an anode of the diode;

a normally-on type N-MOSFET including a drain connected to a gate of the P-MOSFET, a source connected to the external ground, and a gate connected to the source; and a normally-off type N-MOSFET including a drain connected to the drain of the P-MOSFET and connected to the internal ground, and a source connected to the external ground.

* * * * *